(12) United States Patent
Windlass et al.

(10) Patent No.: US 7,271,090 B2
(45) Date of Patent: Sep. 18, 2007

(54) GUARD RING OF A COMBINATION WAFER OR SINGULATED DIE

(75) Inventors: Hitesh Windlass, Hillsboro, OR (US); Wayne K Ford, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 101 days.

(21) Appl. No.: 11/086,187

(22) Filed: Mar. 21, 2005

(65) Prior Publication Data
US 2005/0194692 A1 Sep. 8, 2005

Related U.S. Application Data

(63) Continuation of application No. 10/603,629, filed on Jun. 24, 2003, now Pat. No. 6,879,019.

(51) Int. Cl.
*H01L 21/4763* (2006.01)
(52) U.S. Cl. .............................. 438/638; 257/E21.578
(58) Field of Classification Search ................ 438/601, 438/132, 131, 637, 638, 33, 68, 107, 113; 257/529, 758, 302, 310, E31.578, E21.585, 257/E21.588, E21.577
See application file for complete search history.

(56) References Cited

U.S. PATENT DOCUMENTS

| | | | |
|---|---|---|---|
| 6,100,118 A | 8/2000 | Shih et al. | |
| 6,255,715 B1 | 7/2001 | Liaw | |
| 6,429,502 B1 | 8/2002 | Librizzi et al. | |
| 6,507,086 B1 | 1/2003 | Minn et al. | |
| 6,545,309 B1 | 4/2003 | Kuo | |
| 6,716,679 B2 | 4/2004 | Bae | |

*Primary Examiner*—Howard Weiss
*Assistant Examiner*—(Vikki) Hoa B. Trinh
(74) *Attorney, Agent, or Firm*—Blakely, Sokoloff, Taylor & Zafman LLP

(57) ABSTRACT

A combination wafer is manufactured by (i) forming a plurality of alternating dielectric and metal layers, (ii) forming a guard ring trench in the layers, (iii) forming a guard ring layer in the guard ring trench, and then repeating (i), (ii) with a slightly wider guard ring trench, and (iii). A number of layers are thus simultaneously etched and lined with a guard ring layer, but the number of layers is not so large so as to cause lithographic problems that may occur when a deep, narrow guard ring trench is formed. An upper one of the layers that are patterned is always made of silicon dioxide, which includes less carbon than lower polymer layers and allows for a carbon mask to be formed and be easily removed. The slightly wider guard ring trench each time the process is repeated overcomes lithographic alignment problems that may occur when the guard ring trenches are exactly the same size. Subsequent guard ring layers are partially formed on one another, and provide a moisture seal. The guard ring layers are formed at the same time when vias are formed that are connected to electronic elements.

3 Claims, 5 Drawing Sheets

GUARD RING OF A COMBINATION WAFER OR SINGULATED DIE

This is a Continuation Application of patent application Ser. No. 10/603,629 filed Jun. 24, 2003 now U.S. Pat. No. 6,879,019, which is incorporated herein by reference in its entirety.

BACKGROUND OF THE INVENTION

1. Field of the Invention

This invention relates to the manufacture and structure of a guard ring of a combination wafer or a singulated die.

2. Discussion of Related Art

Integrated circuits are usually formed in and on semiconductor substrates to form a combination wafer that is subsequently "singulated" or "diced" into individual dies. A combination wafer is singulated by directing a blade of a saw through the combination wafer scribe streets that extend in x- and y-directions between individual circuits.

A blade of a saw may cause delamination of dielectric and metal layers that are deposited to form the circuits. In order to prevent such delamination, a guard ring is usually manufactured in the combination wafer around the individual circuits. The circuit of a particular die and the blade are on opposing sides of a guard ring, so that the guard ring prevents delamination of the dielectric and metal layers of the circuit.

BRIEF DESCRIPTION OF THE DRAWINGS

The invention is described by way of example with reference to the accompanying drawings, wherein.

DETAILED DESCRIPTION OF THE INVENTION

A combination wafer is manufactured by (i) forming a plurality of alternating dielectric and metal layers, (ii) forming a guard ring trench in the layers, (iii) forming a guard ring layer in the guard ring trench, and then repeating (i), (ii) with a slightly wider guard ring trench, and (iii). A number of layers are thus simultaneously etched and lined with a guard ring layer, but the number of layers is not so large so as to cause lithographic problems that may occur when a deep, narrow guard ring trench is formed. An upper one of the layers that are patterned is always made of silicon dioxide, which includes less carbon than lower polymer layers and allows for a carbon mask to be formed and be easily removed. The slightly wider guard ring trench each time the process is repeated overcomes lithographic alignment problems that may occur when the guard ring trenches are exactly the same size. Subsequent guard ring layers are partially formed on one another, and provide a moisture seal. The guard ring layers are formed at the same time when vias are formed that are connected to electronic elements.

Figure 1:
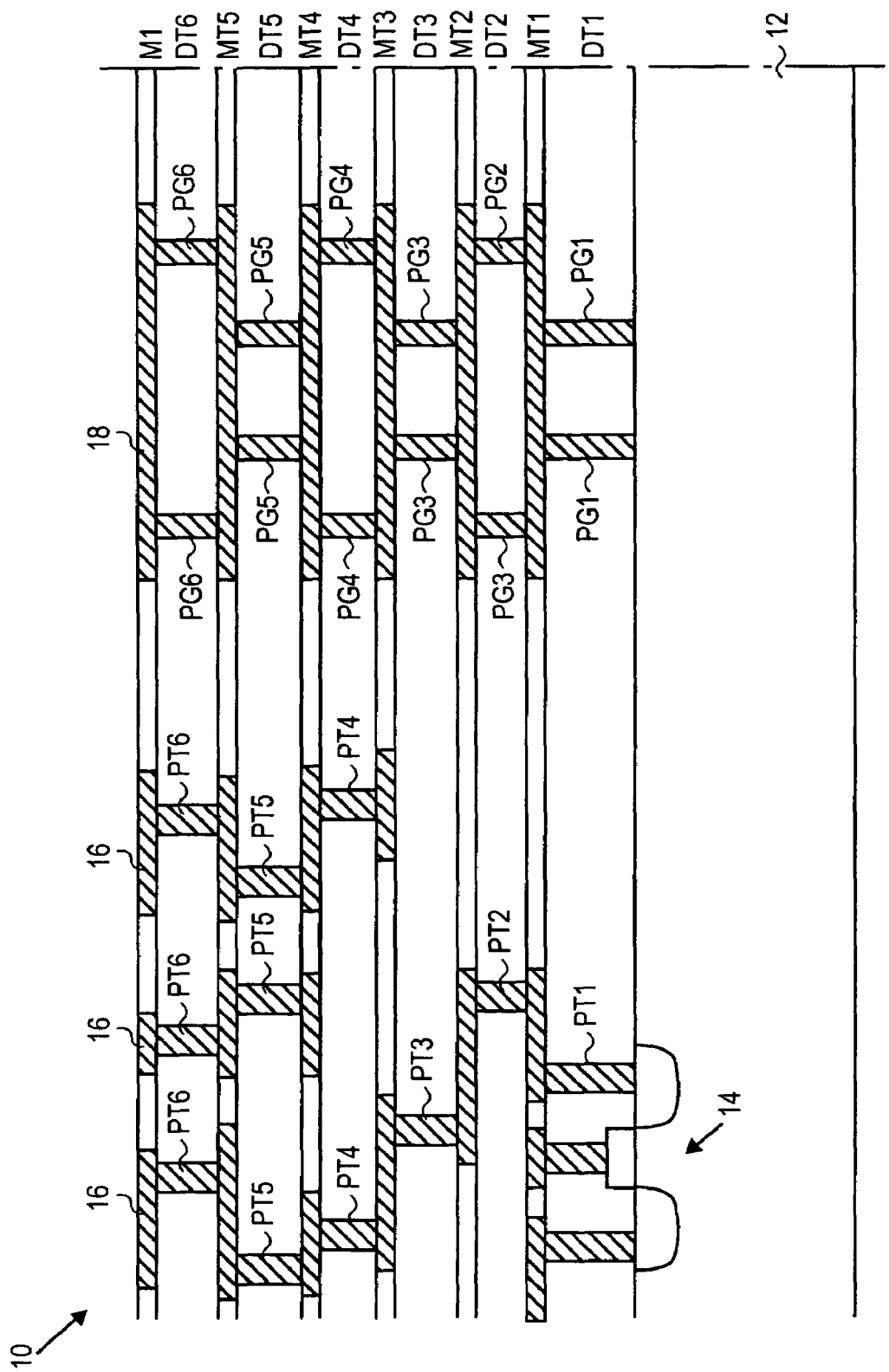
FIG. 1 is a cross-sectional side view of a combination wafer which is partially processed up to a first upper metal layer.

FIG. 1 of the accompanying drawings illustrates a portion of a partially processed combination wafer 10. The combination wafer 10 includes a semiconductor wafer substrate 12, in which and on which an electronic element in the form of a transistor 14 is formed. Other electronic elements such as capacitors, resistors, diodes, etc., may also be formed in and on the semiconductor wafer substrate 12. A first lower dielectric layer DT1 is formed on the semiconductor wafer substrate 12. Via openings are formed in the first lower dielectric layer DT1 and filled with cylindrical lower plugs PT1 and PG1. A first lower layer MT1 of metal lines and metal layers is subsequently formed on the first lower dielectric layer DT1. The metal lines of the first lower layer MT1 are electrically connected to the lower plugs PT1. The metal layers of the first lower layer MT1 are formed on the lower plugs PG1.

The process is repeated so that alternating lower dielectric layers and lower layers of metal lines and metal layers (DT2, MT2, DT3, MT3, DT4, MT4, DT5, MT5, and DT6) are alternatingly formed on top of one another, with lower plugs (PT2, PG2, PT3, PG3, PT4, PG4, PT5, PG5, PT6 and PG6) in each lower dielectric layer (DT2, DT3, DT4, DT5, and DT6). The metal lines together with the lower plugs PTn form electric connections to/from the electric elements represented by the transistor 14. The metal layers together with the lower plugs PGn form a lower guard ring to the right of the electric connections.

A first upper metal layer M1 is subsequently formed on the sixth lower dielectric layer MT6. The first upper metal layer M1 includes metal lines 16. The metal lines 16, together with the lower plugs PTn and metal lines of the lower layers MTn, together with the transistor 14 and other electronic elements, form an integrated circuit which is entirely located in the left of the combination wafer 10. A guard ring base layer 18 is formed above the lower guard ring, to the right of the integrated circuit. There are thus no components of the integrated circuit below the guard ring base layer 18.

Figure 2:
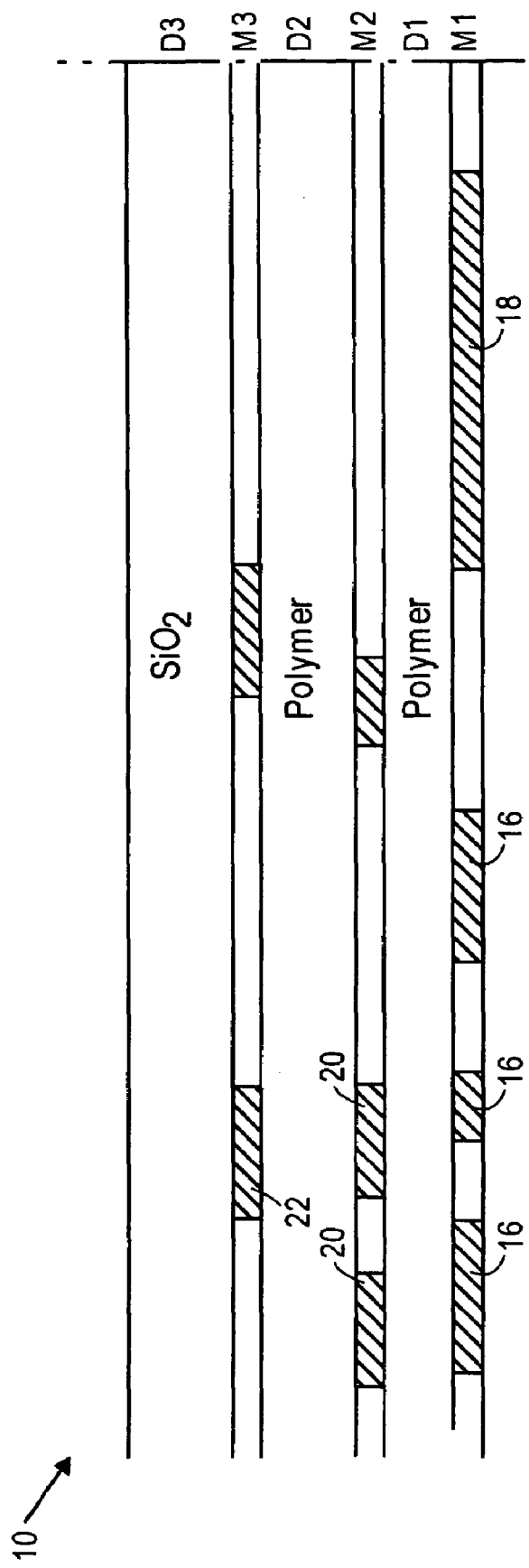
FIG. 2 is a cross-sectional side view illustrating the combination wafer as further processed, including the first upper metal layer and up to a third upper dielectric layer.

As illustrated in FIG. 2, a first upper dielectric layer D1 is deposited on the first upper metal layer M1. A second upper metal layer M2 is then formed on the first upper dielectric layer D1. The second upper metal layer M2 includes metal lines 20 that are connected to the upper plugs P1. The process is then repeated to form a second upper dielectric layer D2 and a third upper metal layer M3 with metal lines 22. The metal layers M2 and M3 are to the left of the guard ring base layer 18. A third upper dielectric layer D3 is formed on the third upper metal layer M3.

Figure 3:
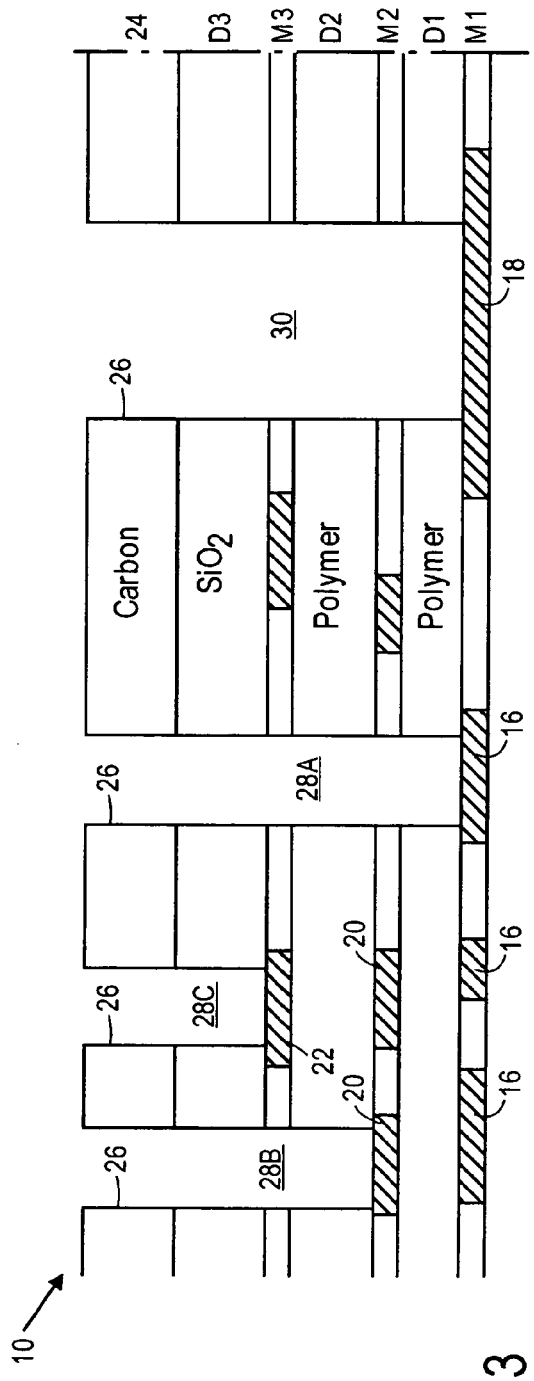
FIG. 3 is a view similar to FIG. 2 after a carbon mask is formed on the third upper dielectric layer and used to pattern the dielectric layers of the combination wafer illustrated in FIG. 2.

Referring now to FIG. 3, a carbon layer 24 is subsequently deposited on the third upper dielectric layer D3. The carbon layer 24 is subsequently patterned to form a mask having a plurality of openings 26 therein. The mask formed by the carbon layer 24 is then used to etch via openings 28 and a guard ring trench 30. Some of the via openings 28A stop at the first upper metal layer M1, while other via openings 28B and 28C stop at the second and third metal layers M2 and M3, respectively. Etching of the guard ring trench 30 stops at the guard ring base layer 18.

The first and second upper dielectric layers D1 and D2 are made of a polymer that includes carbon. The third upper dielectric layer D3 is made of silicon dioxide ($SiO_2$) that includes substantially no carbon. The carbon layer 24 can be formed on the silicon dioxide of the third upper dielectric layer D3 and easily be removed, because of the difference in chemical structures of the third upper dielectric layer D3 and the carbon layer 24. The carbon mask cannot easily be formed and be removed from the carbon-containing polymer of the first or second upper dielectric layers D1 or D2. The number of steps required is also reduced by simultaneously etching the stack of the first, second, and third upper dielectric layers D1, D2, and D3, as opposed to patterning each upper dielectric layer D1, D2, and D3 individually.

Figure 4:
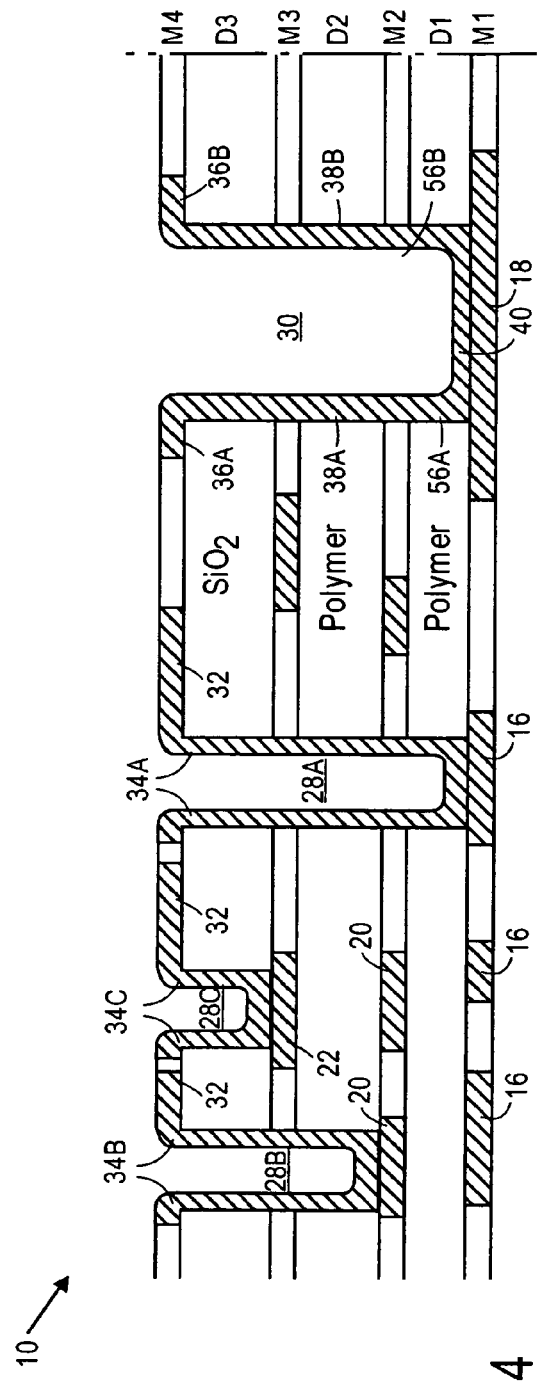
FIG. 4 is a view similar to FIG. 3 after a fourth upper metal layer is formed which includes vias and a first guard ring layer.

As illustrated in FIG. 4, the carbon layer 24 is subsequently removed and a fourth upper metal layer M4 is formed. The fourth upper metal layer M4 includes metal lines 32 on an upper surface of the third dielectric layer D3. The fourth metal layer M4 also forms vias 34 that line the surfaces of the via openings 28. The via 34A in the via opening 28A is also formed on an upper surface of one of the metal lines 16 of the first upper metal layer M1. Vias 34B and 34C, formed respectively in the via openings 28B and 28C, contact metal lines 20 and 22 of the second and third upper metal layers M2 and M3, respectively.

The fourth upper metal layer M4 further forms a first guard ring layer having upper portions 36A and 36B on opposing sides of the guard ring trench 30, side walls 38A and 38B on opposing side surfaces of the guard ring trench 30 and a base portion 40 on the guard ring base layer 18.

Figures 5, 7:
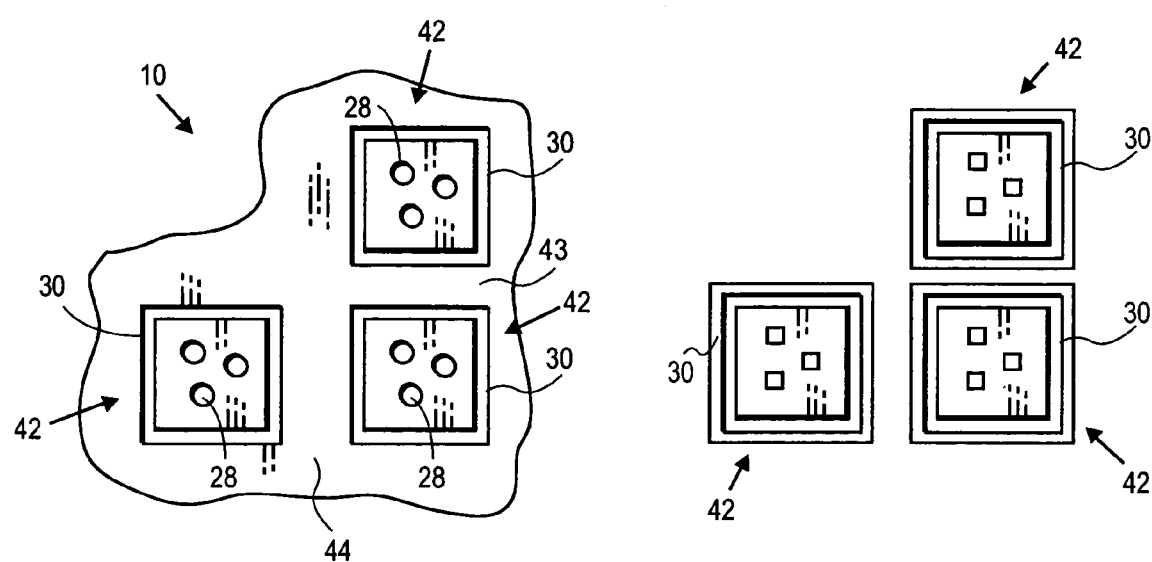
FIG. 5 is a top plan view of the combination wafer of FIG. 4 illustrating the layout of guard ring trenches in which more guard ring layers are formed to define scribe streets between them.
FIG. 7 is a view similar to FIG. 5 after singulation of the combination wafer into individual dies.

As illustrated in FIG. 5, the combination wafer of FIG. 4 has a plurality of unsingulated dies 42. Each unsingulated die 42 has a respective circuit with via openings 28 formed therein. Each unsingulated die 42 also has a respective guard ring trench 30 in a rectangular form that entirely surrounds the respective circuit of the respective unsingulated die 42. Scribe streets 43 are defined between the guard ring trenches 30 and extend in x- and y-directions across the combination wafer 10.

Figure 6:
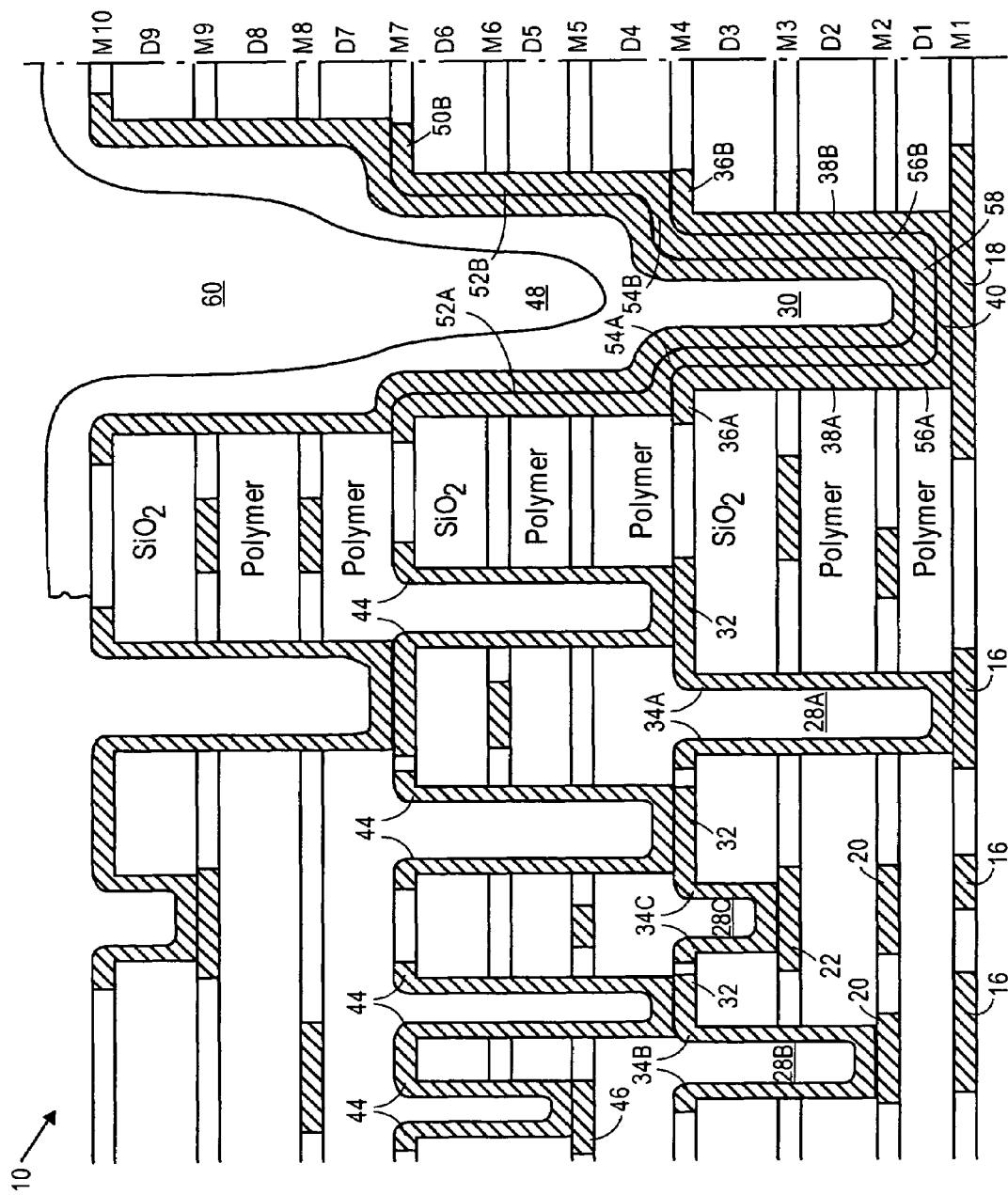
FIG. 6 is a view similar to FIG. 4 after further processing of the combination wafer, wherein the processing steps of FIGS. 3 and 4 are repeated two more times, each time with a wider guard ring trench.

FIG. 6 illustrates the combination wafer 10 after the processing steps illustrated in FIGS. 3 and 4 are repeated two more times, to form fourth to ninth dielectric layers D4, D5, D6, D7, D8, and D9, alternated with fifth through tenth metal layers M1, M5, M6, M7, M8, M9, and M10. The fourth and fifth upper dielectric layers D4 and D5 are made of a polymer, and the sixth dielectric layer D6 is made of silicon dioxide, on which a carbon mask is formed. Vias 44 of the seventh upper metal layer M7 come down onto either the metal lines 32 of the fourth upper metal layer M4, or metal lines 46 of the fifth upper metal layer M5 (or metal lines of the sixth upper metal layer M6).

A guard ring trench 48 is formed in the fourth, fifth, and sixth upper dielectric layers D4, D5, and D6. The guard ring trench 48 is located above the guard ring trench 30, and is wider than the guard ring trench 30. One reason why the guard ring trench 48 is wider than the guard ring trench 30 is because the guard ring trench 48 cannot be made as wide as the guard ring trench 30, given lithographic imaging constraints.

The seventh upper metal layer M7 forms a second guard ring layer having portions 50A and 50B on an upper surface of the sixth upper dielectric layer D6 on opposing sides of the guard ring trench 48. The second guard ring layer also has portions 52A and 52B on side surfaces of the guard ring trench 48, portions 54A and 54B on the portions 36A and 36B of the first guard ring layer, portions 56A and 56B on the portions 38A and 38B of the first guard ring layer, and a base portion 58 on the base portion 40 of the first guard ring layer. An interface between the first guard ring layer and the second guard ring layer, especially between the portions 54A and 36A, and the portions 54B and 36B, provides an efficient moisture seal.

For purposes of simplicity, the combination wafer 10 is shown up to the tenth upper metal layer M10. It should, however, be understood that the process illustrated in FIGS. 3 and 4 may again be repeated to form up to a fourteenth upper metal layer. The tenth upper metal layer forms a third guard ring layer that is formed on side surfaces of a guard ring trench 60 located above and which is wider than the guard ring trench 48, and on the second guard ring layer. An upper guard ring is thus formed which includes the first, second, and third guard ring layers.

By repeating the process of FIGS. 3 and 4 in the manner illustrated with reference to FIG. 6, a number of layers (e.g., D4, D5, and D6) are simultaneously etched and lined with a guard ring layer. The number of layers that are simultaneously processed are not so many that would create lithographic problems (as may occur when a deep narrow guard ring trench has to be formed). A further advantage is that the guard ring layers are formed at the same time that the vias are formed.

Referring now to FIG. 7, the combination wafer 10 is subsequently sawed or "diced" into singulated dies 42 by directing a blade of a saw through the combination wafer 10 along scribe streets 43 of FIG. 5. A respective guard ring, including a plurality of guard ring layers, is formed in each one of the guard ring trenches 30. Each upper guard ring (FIG. 6), together with a respective lower guard ring (FIG. 1), protects a circuit of a respective die by preventing delamination of the dielectric and metal layers that the circuit is made of when the blade travels through the combination wafer along a scribe street 43 on an opposing side of the respective guard ring.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed is:

1. A method of making a combination wafer, comprising:
    forming a first ground ring trench having a first width into a first set of alternating dielectric layers and layers of metal lines on a substrate having a plurality of electronic elements formed therein or thereon;
    forming a first metal layer including a first guard ring layer on surfaces of the first guard ring trench and a first via connected to one of the electronic elements;
    forming a second guard ring trench having a second width which is more than the first width above the first guard ring trench into a second set of alternating dielectric layers and layers of metal lines on the first set; and
    forming a second metal layer including a second guard ring layer on surfaces of the second guard ring trench and a second via connected to one of the electronic components.

2. The method of claim 1, further comprising:
forming the second set of layers after the first guard ring layer is formed.

3. The method of claim 1, wherein:
(i) the first guard ring layer is partially formed on a top surface of a layer of the first set; and
(ii) the second guard ring layer is partially formed on a top surface of the first guard ring layer where the first guard ring layer is formed on the top surface of the layer of the first set.

* * * * *